United States Patent
Park (10) Patent No.: US 7,164,609 B2
(45) Date of Patent: Jan. 16, 2007

(54) DEVICE FOR CONTROLLING DATA OUTPUT FOR HIGH-SPEED MEMORY DEVICE AND METHOD THEREOF

(75) Inventor: Nak Kyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 11 days.

(21) Appl. No.: 11/108,314

(22) Filed: Apr. 18, 2005

(65) Prior Publication Data
US 2006/0104126 A1 May 18, 2006

(30) Foreign Application Priority Data
Nov. 15, 2004 (KR) .................. 10-2004-0093122

(51) Int. Cl.
*G11C 11/34* (2006.01)
(52) U.S. Cl. .................... 365/189.05; 365/233
(58) Field of Classification Search .......... 365/189.05, 365/233
See application file for complete search history.

(56) References Cited

U.S. PATENT DOCUMENTS

| 6,972,998 B1* | 12/2005 | Gibson et al. ......... 365/189.05 |
| 2003/0108139 A1* | 6/2003 | Jung ........................ 375/376 |

* cited by examiner

*Primary Examiner*—Michael Tran
(74) *Attorney, Agent, or Firm*—Ladas & Parry LLP

(57) ABSTRACT

Disclosed are a DDR group (DDR I, DDR II, DDR III, ... ) data output control device for controlling a time point of data output by using a DLL circuit and a method thereof. The data output control device includes a latch part for storing data read out from a memory cell array through a read operation, a control part for controlling an operation of the latch part, and an initialization signal generating part for generating an initialization signal for resetting an operation of the control part, wherein the initialization signal is synchronized with a clock signal generated from a DLL circuit in the memory device.

11 Claims, 10 Drawing Sheets

DEVICE FOR CONTROLLING DATA OUTPUT FOR HIGH-SPEED MEMORY DEVICE AND METHOD THEREOF

BACKGROUND OF THE INVENTION

1. Field of the invention

The present invention relates to a data output control device for a high-speed memory device and a method for controlling the same, and more particularly to a DDR SDRAM data output control device for controlling by a DLL circuit a time point at which data is outputted and a method thereof.

2. Description of the Prior Art

Figure 1:
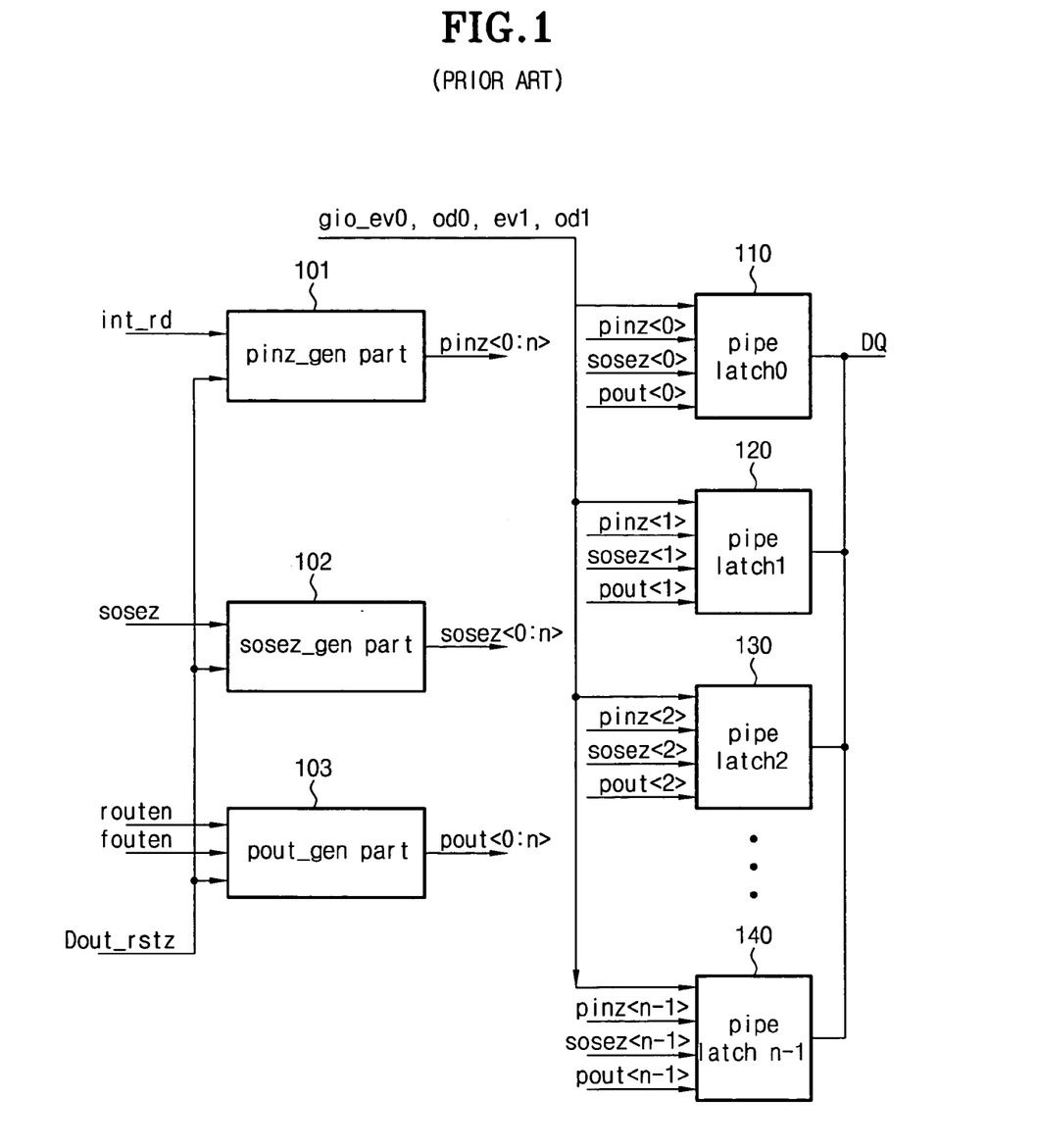
FIG. 1 is a block diagram showing an example of a data outputting circuit employed for the conventional DDR SDRAM.
Figure 2:
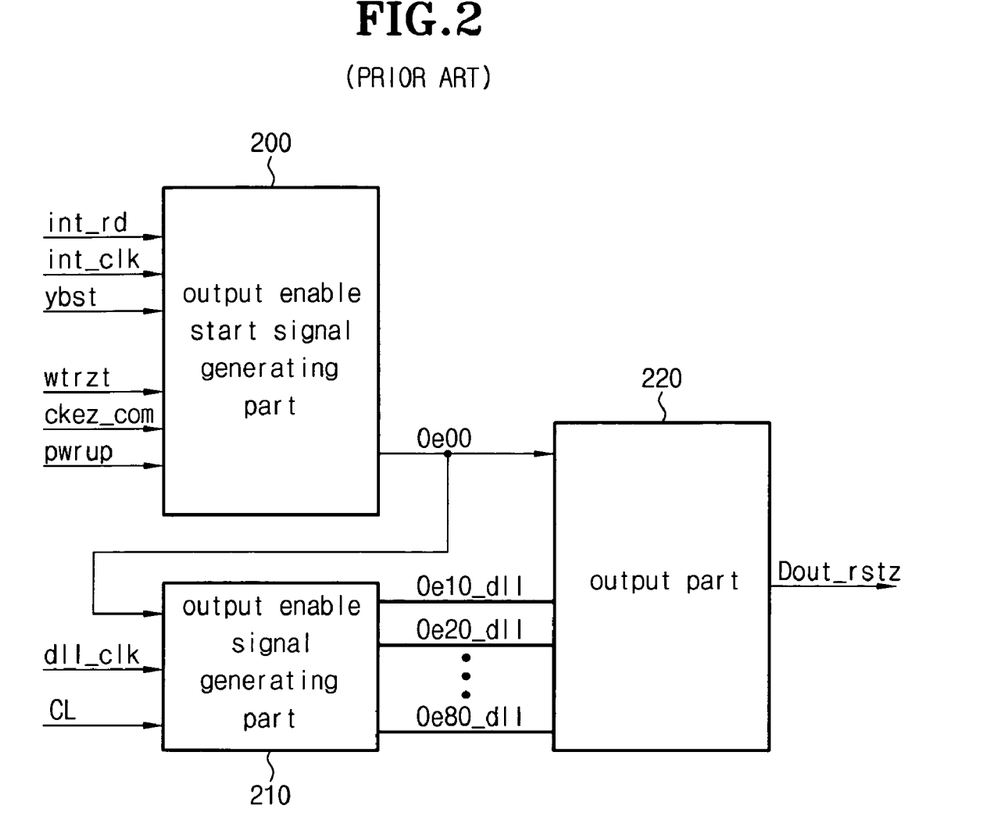
FIG. 2 is a block diagram showing an example of a circuit for generating a signal Dout_rstz applied to the circuit shown in FIG. 1.

As generally known in the art, FIG. 1 is a block diagram showing an example of a data outputting circuit employed for the conventional DDR SDRAM, and FIG. 2 is a block diagram showing an example of a circuit for generating a signal Dout_rstz applied to the circuit shown in FIG. 1.

Prior to description about an operation of the data outputting circuit, the meanings of signals shown in FIGS. 1 and 2 will be first described.

In FIG. 1, "Int_rd" denotes a control signal for controlling a control part 101 as a read command generated in synchronization with an internal clock signal int_clk. "Sosez" denotes an output control signal for controlling a control part 102 as an abbreviation of "start odd start even". "Routen" denotes an output control signal synchronized with a rising edge of a clock signal dll_clk outputted from a DLL circuit, and "fouten" denotes a control signal synchronized with a falling edge of the clock signal dll_clk outputted from the DLL circuit. "Gio_ev0", "gio_od0", "gio_ev1", and "gio_od1" denote global input/output lines for delivering data read out through a read operation.

A data output control device includes control parts 101 to 103.

Output signals pinz<0:n> of the control part 101 input data on the global input/output lines gio_ev0, gio_od0, gio_ev1, and gio_od1 to pipe latches 110 to 140.

Output signals sosez<0:n> of the control part 102 denote signals for changing the sequence in which data on the global input/output lines gio_ev0, gio_od0, gio_ev1, and gio_od1 is transferred when the data is transferred in series.

Output signals pout<0:n> of the control part 103 output the data stored in the pipe latches 110 to 140.

An initialization signal Dout_rstz commonly applied to the control parts 101 to 103 denotes an output signal of the circuit shown in FIG. 2. The initial signal Dout_rstz is an abbreviation of "Data output resetz" and resets the control parts 101 to 103 at a low level.

The pipe latches 110 to 140 for storing data output data to the outside thereof based on CAS latency. The number of pipe latches is determined depending on a time point at which data are applied to the global input/output lines by means of the read command and a time point at which previous data stored in pipe latches are outputted to the outside thereof. In the present invention, for the purpose of description, a case in which the number of pipe latches is five as understood from FIGS. 3 and 4 will be described.

In FIG. 2, "int_clk" denotes an internal clock signal obtained by buffering an external clock applied to a memory device. "Int_rd" denotes an internal read command generated in synchronization with the internal clock signal int_clk. "Ybst" denotes "burst stop" at a read operation. The state of "wtrzt" switches to a high level if a write command is applied and a low level if a read command is applied. "Ckez_com" denotes a signal maintaining a high level when a memory device is in deactivation states such as a power down mode and a self-refresh mode. "Pwrup" denotes a signal for stably initializing the memory device in the first stage for supplying a supply voltage to the memory device. "Dll_clk" denotes a clock signal generated in the DLL circuit.

Hereinafter, the operation of the data outputting circuit shown in FIG. 1 will be described.

First, if a read command is externally applied to the data outputting circuit, the internal read command is generated in synchronization with the internal clock signal int_clk.

Thereafter, data on a memory cell array are delivered to the global input/output lines gio_ev0, gio_od0, gio_ev1, and gio_od1 by means of the internal read command int_rd.

Then, the data on the global input/output lines are inputted to the pipe latches 110 to 140 by means of the output signals pinz<0:n>.

Thereafter, when the data inputted in parallel and latched in the pipe latches 110 to 140 are sequentially outputted, the output signals sosez<0:n> of the control part 102 are used for changing the sequence of outputting the data.

Lastly, the data stored in the pipe latches 110 to 140 are outputted in the outside thereof by means of the output signals pout<0> of the control part 103.

FIG. 2 is a block diagram showing the circuit for generating the initialization signal Dout_rstz, and the circuit includes an output enable start signal generating part 200, an output enable signal generating part 210, and an output part 220.

The output enable start signal generating part 200 outputs a start signal Oe00 having enable duration corresponding to a burst length.

The output enable signal generating part 210 receives the start signal Oe00, the clock signal dll_clk, and information about CAS latency. The output enable signal generating part 210 synchronized with the clock signal dll_clk delays the start signal Oe00 by a predetermined time based on CAS latency.

For example, if CAS latency is 2, the output enable signal generating part 210 outputs an output signal Oe10_dll synchronized with the clock signal dll_clk by delaying the start signal Oe00 by a predetermined time. If CAS latency is 3, the output enable signal generating part 210 outputs an output signal Oe20_dll synchronized with the clock signal dll_clk by more delaying the output signal Oe10_dll by a predetermined time. An output signal Oe80_dll denotes an output signal when CAS latency is 9.

The output part 220 receives the start signal Oe00 and the output enable signals Oe10_dll, Oe20_dll, ..., Oe80dll so as to output the initialization signal Dout_rstz for determining an initialization time point of the control parts 101 to 103 shown in FIG. 1. After the data are outputted to the outside of the data outputting circuit based on CAS latency, the initialization signal Dout_rstz resets the operations of the control parts 101 to 103.

Figure 3:
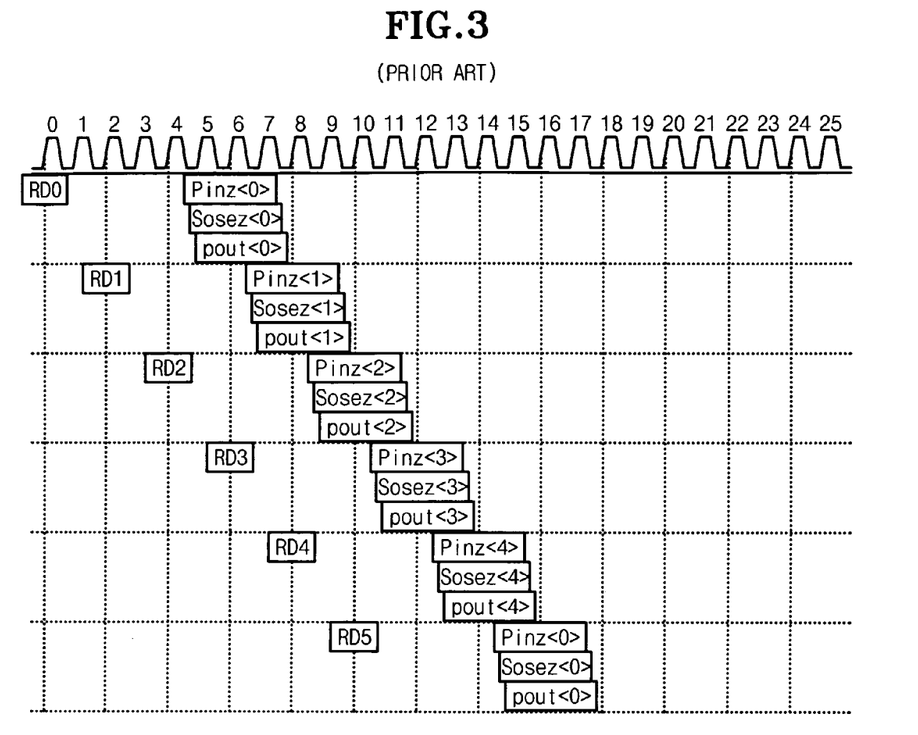
FIGS. 3 to 10 are time charts for explaining the conventional data outputting operation.

FIG. 3 is a time chart showing the conventional gapless read operation of sequentially applying read commands RD0, RD1, RD2, RD3, and RD4. For reference, when the burst length is 4 and when the number of pipe latches is 5, a read operation will be described with reference to FIG. 3. In FIG. 3, the internal clock signal int_clk has the frequency of about 500 Mhz.

As understood from FIG. 3, the first read command RD0 is applied, the first data (4 bits) on the global input/output lines are stored in the pipe latch 110 by means of the control signal pinz<0>. After that, the sequence of outputting the data stored in the pipe latch 110 is adjusted by means of the control signal sosez<0>. Lastly, the first data (4 bits) stored in the pipe latch 110 are outputted to the outside of the pipe latch 110 by means of the control signal pout<0>.

If the second read command RD1 is applied, the control signals pinz<1>, sosez<1>, and pout<1> are enabled in sequence. Accordingly, the second data (4 bits) are stored in the pipe latch 120 and then outputted to the outside of the pipe latch 120.

When the remaining read commands RD2, RD3, and RD4 are applied in sequence, the operation following the occurrence of the read commands is performed as described above.

As understood from FIG. 3, if the read command RD5 is applied, the first pipe latch 110 is used because the number of pipe latches is five.

Figure 4:
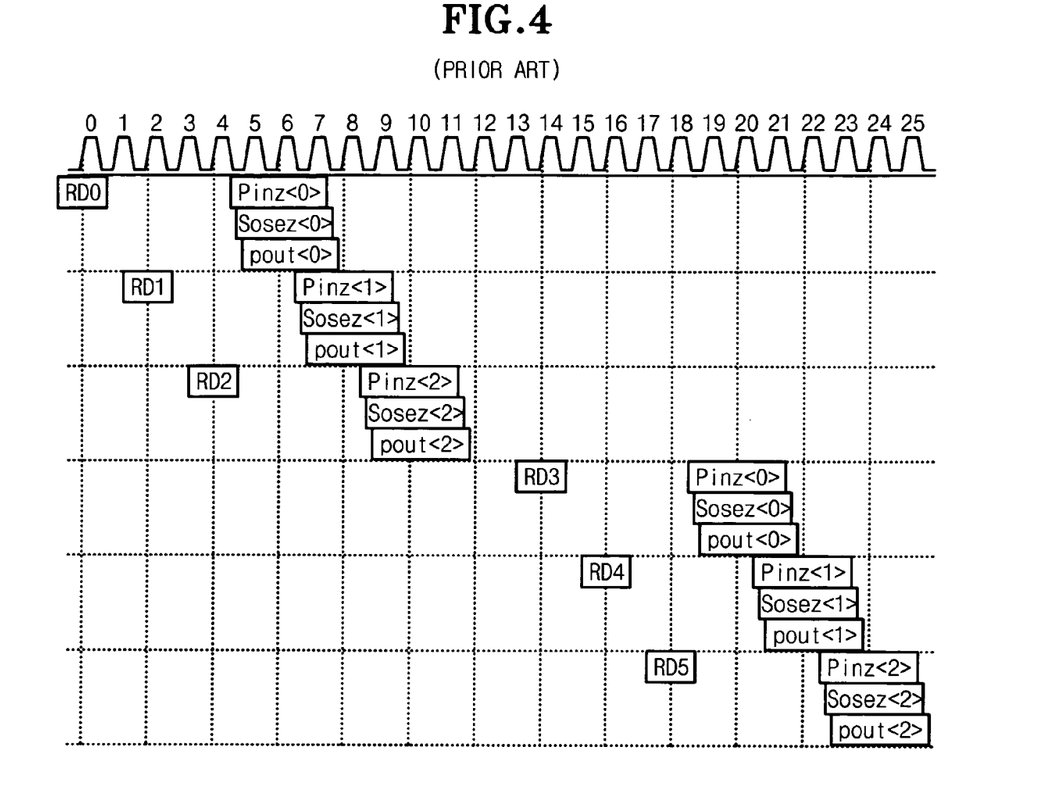

FIG. 4 is a time chart for explaining a gap read operation in which a predetermined time interval lapses after each read command is applied.

As understood from FIG. 4, after the pipe latch 130 is operated by means of the read command RD2, the control parts 101 to 103 are initialized by means of the initialization signal Dout_rstz. Accordingly, the first pipe latch 110 is enabled by means of the read command RD3 applied after the lapse of a predetermined duration. Thus, the pipe latches 120 and 130 are enabled by means of the sequentially applied read commands RD4 and RD5, respectively.

Figure 5:
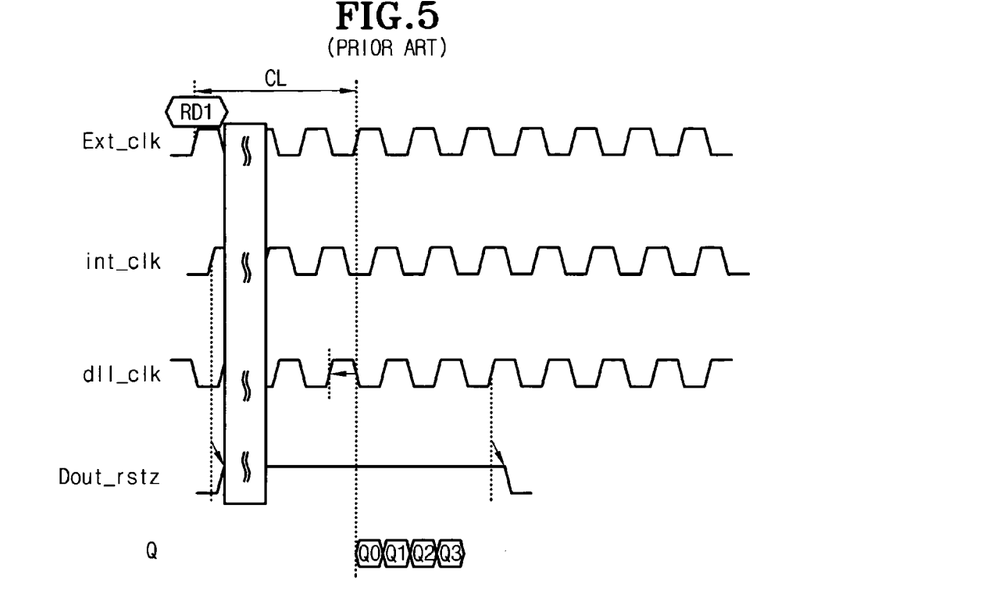

FIG. 5 is a time chart for explaining timing of disabling or enabling the initialization signal Dout_rstz for controlling the operations of the control parts 101 to 103 shown in FIG. 1 when a read command is applied.

In FIG. 5, "CL", "RD1", "Ext_clk", "int_clk", and "dll_clk" denote CAS latency, a read command, an external clock signal applied to a memory device, an internal clock signal for buffering the external clock signal Ext_clk, and an output signal of the DLL circuit, respectively. In addition, "Dout_rstz" denotes the initialization signal having been explained with reference to FIGS. 1 and 2, and "Q" denotes data. The initialization signal "Dout_rstz" is enabled at a low level and resets the control parts 101 to 103 shown FIG. 1.

As shown in FIG. 5, conventionally, the initialization signal Dout_rstz for resetting the control parts 101 to 103 is disabled at a high level in synchronization with the rising edge of the internal clock signal of a read command occurring time point. Accordingly, the control parts 101 to 103 enter into normal operation modes.

After data Q0, Q1, Q2, and Q3 of 4 bits are sequentially outputted from the pipe latches based on the CL, the initialization signal Dout_rstz is enabled at a low level in synchronization with the rising edge of the dll_clk and resets the control parts 101 to 103.

Figure 6:
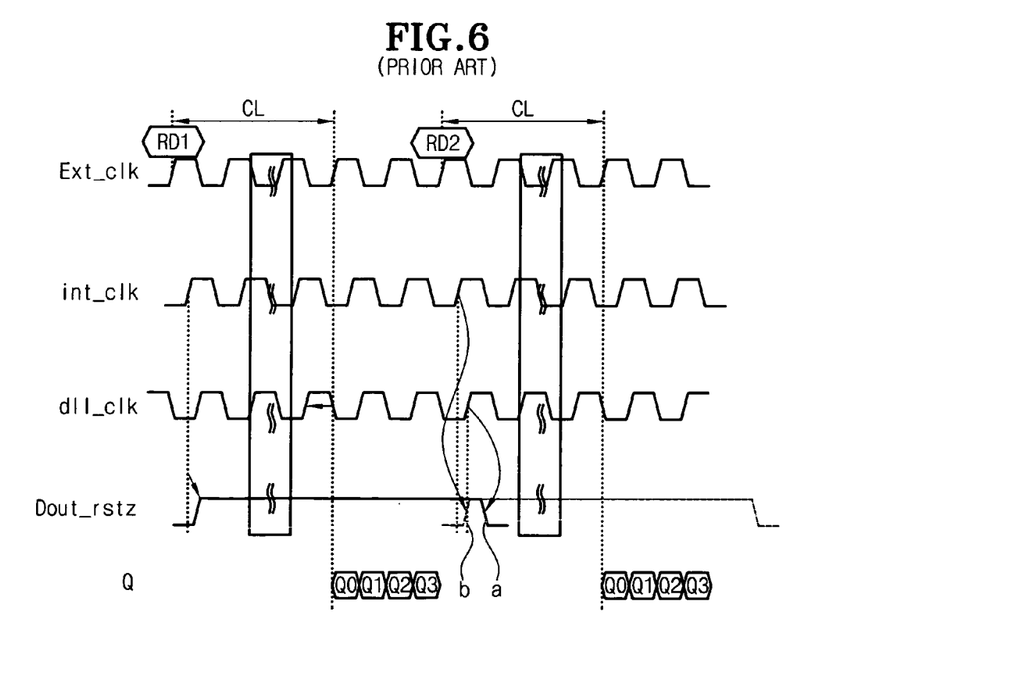
Figure 7:
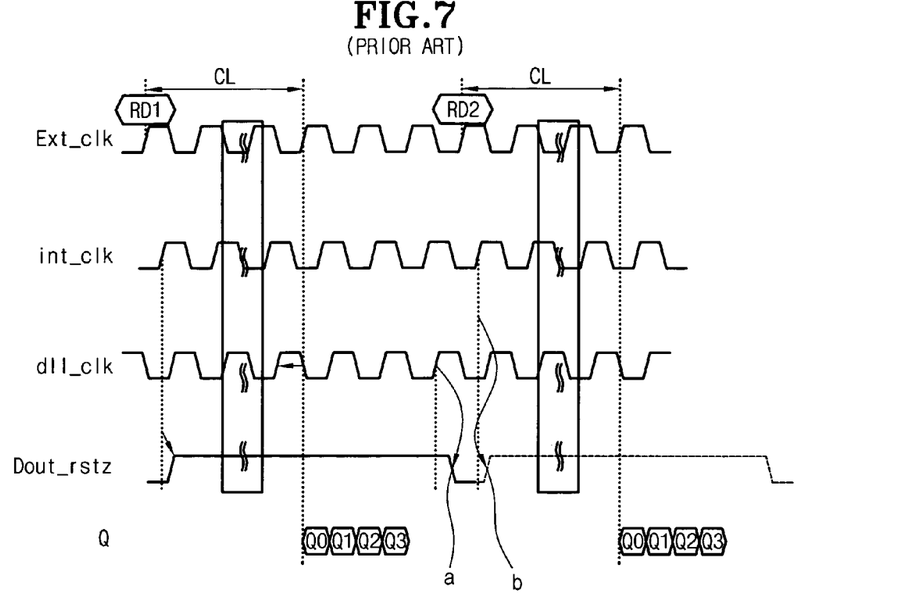

FIGS. 6 and 7 are time charts for explaining stable output of data corresponding to sequentially applied read commands. In particular, FIG. 6 is a time chart for explaining a case in which the initialization signal Dout_rstz maintains a disable state as shown in FIG. 3, and FIG. 7 is a time chart for explaining a case of outputting data after the initialization signal Dout_rstz is enabled at a low level and initializes the control parts 101 to 103 as shown in FIG. 4.

In FIG. 6, timing (a) for enabling the initialization signal Dout_rstz at a low level by means of the first read command RD1 is later than timing (b) for disabling the initialization signal Dout_rstz at a high level by means of the second command RD2. As a result, since the initialization signal Dout_rstz is continuously disabled at the high level, the control parts 101 to 103 perform normal operations. Accordingly, data may be outputted through pipe latches in sequence as shown in FIG. 3.

FIG. 7 is a time chart for explaining a gap read operation. As understood from FIG. 7, timing (a) for enabling the initialization signal Dout_rstz at a low level by means of the first read command RD1 is sufficiently faster than timing (b) for disabling the initialization signal Dout_rstz at a high level by means of the second command RD2. Accordingly, after data are outputted by means of the read command RD1, the control parts 101 to 103 are reset by means of the initialization signal Dout_rstz. When the read command RD2 is applied after the lapse of a predetermined duration, the initialization signal Dout_rstz is disabled at a high level. Accordingly, this is identical to the case in which the read command RD3 is applied after the read command RD2.

Here, the followings must be noted in FIGS. 5 and 7.

As understood from FIGS. 5 to 7, a time point at which the initialization signal Dout_rstz is disabled at a high level is synchronized with the rising edge of the internal clock signal int_clk of a read command occurring time point, and a time point at which the initialization signal Dout_rstz is enabled at a low level is synchronized with the rising edge of the clock signal dll_clk. Therefore, this causes problems shown in FIGS. 8 and 9 when the operation frequency of a memory device increases.

Figure 8:
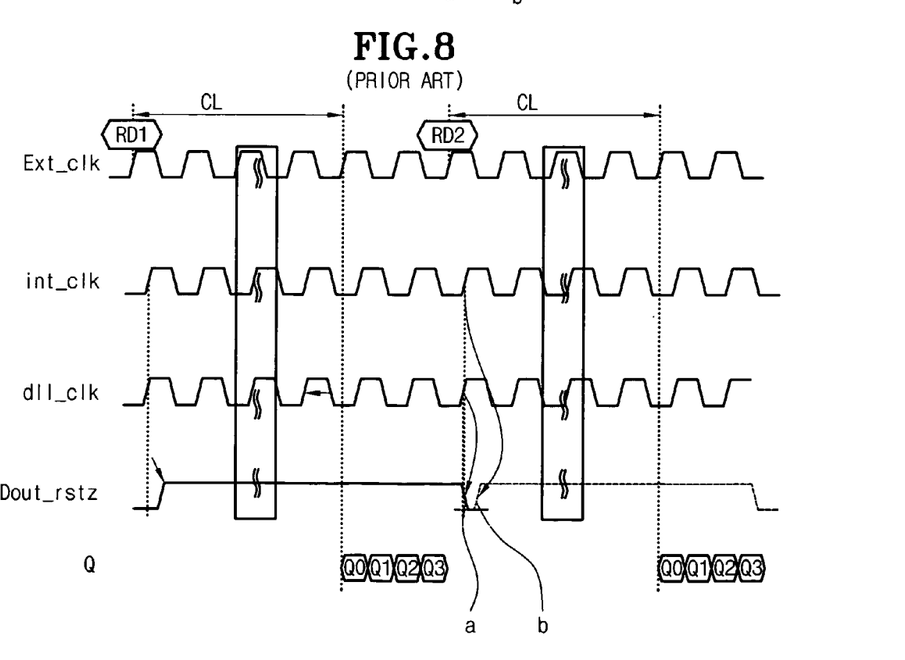

Herein, the frequency of the external clock signal Ext_clk shown in FIG. 8 is much higher than that shown in FIG. 7. Accordingly, as understood from FIG. 8, a phase difference between the internal clock signal int_clk and the clock signal dll_clk is very small.

In FIG. 8, a time point at which the initialization signal Dout_rstz is enabled at a low level by means of the first read command RD1 and a time point b at which the initialization signal Dout_rstz is disabled at a high level by means of the second read command RD2 have a very small difference. For this reason, the initialization signal Dout_rstz has error signals such as glitches.

Figure 9:
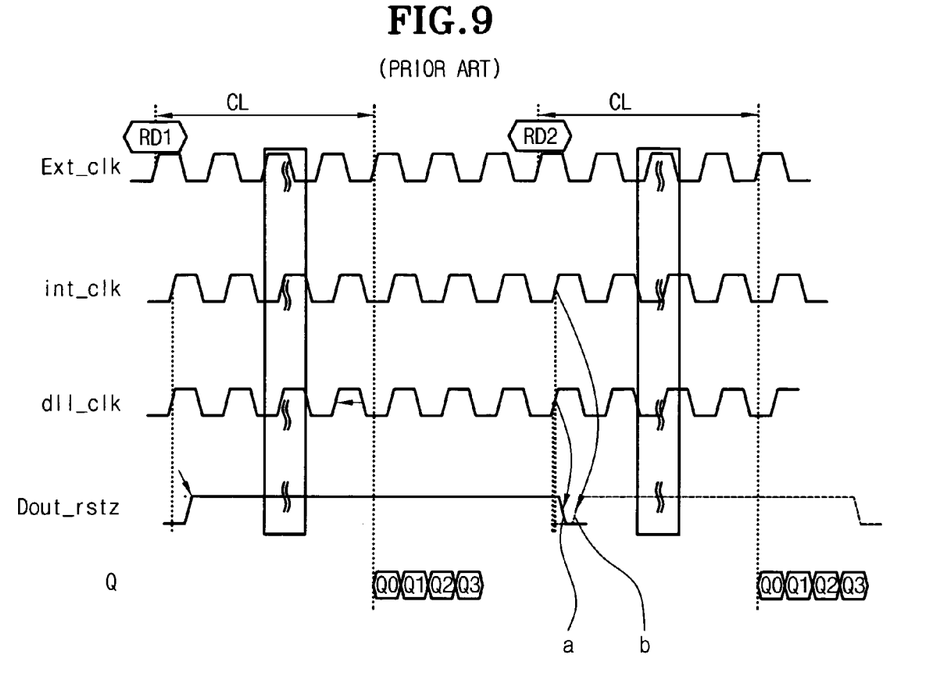

FIG. 9 is a time chart for explaining a case of increasing disabling duration of the initialization signal Dout_rstz in order to solve the problem shown in FIG. 8. As understood from FIG. 9, although the disabling duration of the initialization signal Dout_rstz increases, the error signals such as glitches shown in FIG. 8 occur when an operation frequency is a high frequency.

Hereinafter, the fact that a data outputting operation may be unstable when the error signals such as glitches described with reference to FIGS. 8 and 9 occur in the initialization signal Dout_rstz, will be described with reference to FIG. 10.

Figure 10:
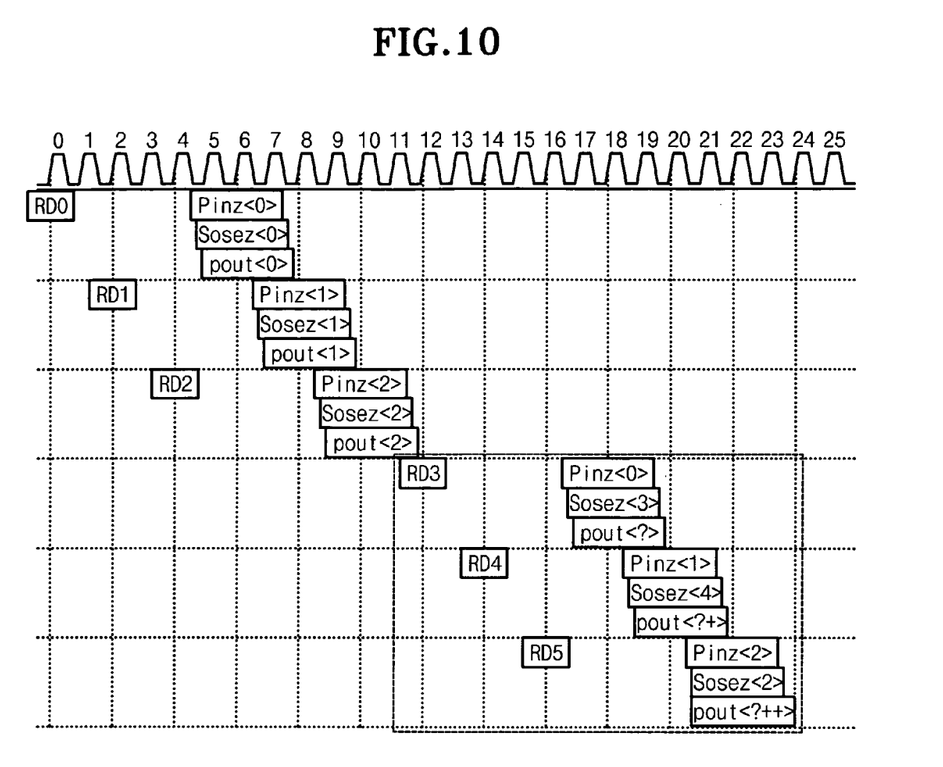

FIG. 10 is a time chart for showing an example of the gap read operation having been described with reference to FIG. 4 and explaining an unstable data outputting operation when an operation frequency increases. For reference, it is preferred that FIG. 10 is understood with FIGS. 8 and 9.

As understood from FIG. 10, if the data outputting operation has been finished by means of the read command RD2, the read command RD3 is applied after the lapse of a predetermined duration. However, when an operation frequency is high, the error signals such as glitches occur in the initialization signal Dout_rstz as described with reference to FIG. 9. For this reason, the control parts 101 to 103 may not be reset at the same time. Hereinafter, this operation will be described.

For example, when the error signals such as glitches occur in the initialization signal Dout_rstz, the control part 101 may be reset, but the control part 102 may not be reset by means of the initialization signal Dout_rstz. In this case, although the control signal pinz<0> for storing data on the global input/output lines in the first pipe latch 110 is generated by means of the initialized control part 101, the control signal sosez3 is generated because the control part 102 is not initialized. Thereafter, the control part 103 selects one of the pipe latch 110 and the pipe latch 130 depending on whether or not the control part 103 is reset by the initialization signal Dout_rstz and outputs data stored in the selected pipe latch to the outside thereof. For this reason, the data on the global input/output lines may be stored in the pipe latch 110 by means of the read command RD3 and data stored in the pipe latch 130 may be outputted to the outside thereof.

As understood from FIGS. 5 to 9, this is because a time point, at which the initialization signal Dout_rstz is enabled, is synchronized with the rising edge of the clock signal dll_clk, and a time point, at which the initialization signal Dout_rstz is disabled, is synchronized with the rising edge of the internal clock signal int_clk.

The possibility of causing erroneous data output due to this is remarkably raised when the operation frequency of a memory device increases (see FIGS. 8 and 9).

As described above, conventionally, since a time point at which the initialization signal Dout_rstz is enabled and a time point at which the initialization signal Dout_rstz is disabled are controlled by two different signals int_clk and dll_clk, errors may be caused in a high-speed read operation of a memory device.

In addition, when a time point, at which the initialization signal Dout_rstz is enabled or disabled, is controlled in synchronization with a phase identical to that of the signal dll_clk (a rising edge vs a rising edge and a falling edge vs a falling edge), errors may be caused due to the delay difference between an enable signal and a disable signal.

SUMMARY OF THE INVENTION

Accordingly, the present invention has been made to solve the above-mentioned problems occurring in the prior art, and an object of the present invention is to provide a method and a circuit for controlling by using only a clock signal dll_clk a time point at which an initialization signal Dout_rstz is enabled or disabled.

In particular, it is another object to provide a method and a circuit for controlling by using a rising edge or a falling edge of a clock signal dll_clk a time point at which an initialization signal Dout_rstz is enabled or disabled.

Also, it is still another object to provide a method for resetting a control part only in a stable operation mode and not a read operation mode by using a rising edge and a falling edge of a clock signal dll_clk.

In order to accomplish these objects, there is provided a data output control device for a high-speed memory device, including a latch part for storing data read out from a memory cell array through a read operation, a control part for controlling an operation of the latch part, and an initialization signal generating part for generating an initialization signal for resetting an operation of the control part, wherein the initialization signal is synchronized with a clock signal generated from a DLL circuit in the memory device.

According to the present invention, a time point, at which the initialization signal is disabled, is synchronized with a falling edge of the clock signal corresponding to a read command, and a time point, at which the initialization signal is enabled, is synchronized with a rising edge of the clock signal corresponding to a burst stop command.

Also, according to the present invention, a time point, at which the initialization signal is disabled, is synchronized with a falling edge of the clock signal corresponding to a read command, and a time point, at which the initialization signal is enabled, is synchronized with a rising edge of the clock signal corresponding to a burst stop command.

In addition, according to the present invention, it is possible to perform a reset operation only in a deactivation state, a write mode, a power down mode & a self-research mode, and a power initialization mode (i.e, a stable mode and not a read mode).

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 11:
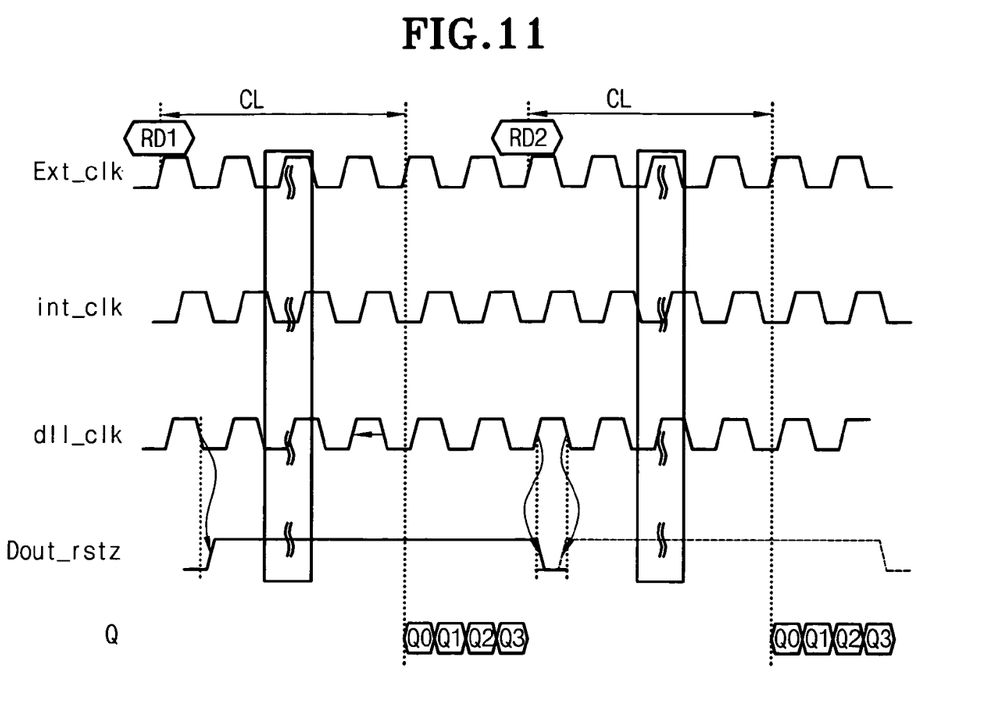
FIG. 11 is a time chart for explaining a data outputting operation according to the present invention.

FIG. 11 is a time chart for explaining a data output control method for a high-speed memory device according to the present invention. For reference, components of the data outputting circuit shown in FIG. 1 are identically employed for the present invention. Differently from the conventional technique, the present invention includes circuit parts (FIGS. 12 and 13) for generating an initialization signal.

In FIG. 11, "CL", "RD1" and "RD2", "Ext_clk", "int_clk", and "dll_clk" denote CAS latency, read commands, an external clock signal applied to a memory device, an internal clock signal for buffering the external clock signal Ext_clk, and an output signal of a DLL circuit, respectively. In addition, "Dout_rstz" denotes an initialization signal to be explained with reference to FIG. 12, and "Q" denotes data. The initialization signal "Dout_rstz" is enabled at a low level and resets the control parts 101 to 103 shown FIG. 1.

Hereinafter, the data output control method will be described.

First, if the read command RD1 is applied, the initialization signal Dout_rstz is disabled at a high level in synchronization with the falling edge of the clock signal dll_clk corresponding to the read command RD1. Accordingly, the control parts 101 to 103 shown in FIG. 1 enter into normal operation modes.

Thereafter, data read out from a memory cell array are delivered to the global input/output lines shown in FIG. 1 by means of the read command RD1.

Then, the data on the global input/output lines are inputted to the pipe latch 110 by means of the output signal pinz<0> of the control part 101. Herein, as described above, the data inputted to the pipe latch 110 have 4 bits because the present invention employs the burst length of 4.

After that, in order to change the sequence of outputting the data latched in the pipe latch 110, the output signal sosez<0> of the control part 102 is used.

Then, the data stored in the pipe latch 110 are outputted to the outside thereof by the output signal pout<0> of the control part 103. As understood from FIG. 11, after the data are outputted by means of the read command RD1, the initialization signal Dout_rstz is enabled at a low level in synchronization with a rising edge of the clock signal dll_clk.

Thereafter, if the read command RD2 is applied, the initialization signal Dout_rstz is disabled at a high level in synchronization with the falling edge of the clock signal dll_clk corresponding to the read command RD2. As understood from FIG. 11, the initialization signal Dout_rstz is disabled at a high level in synchronization with the falling edge of the clock signal dll_clk. Thus, the control parts 101 to 103 shown in FIG. 1 enter into normal operation modes, and then, the data outputting procedure described above is repeated. In other words, the operation after the entrance into the normal operation modes is performed as described with reference to FIGS. 3 and 4.

It can be understood from FIG. 11 that the initialization signal according to the present invention is synchronized with the falling edge and the rising edge of the clock signal dll_clk. Accordingly, the occurrence of error signals such as glitches described with reference to FIGS. 8 and 9 is radically prevented. In other words, the margin of 0.5 tCLK ("tCLK" denotes the period of the clock signal dll_clk) can be ensured. Therefore, the error signals such as glitches can hardly occur in the initialization signal because the margin of 0.5 tCLK is always ensured even when the operation frequency of the memory device increases. Accordingly, the data are stably outputted.

As described above, in order to adjust a time point for the reset of a control part for controlling the operation of a latch part storing data outputted to the outside thereof, the data output control method for the high-speed memory device described with reference to FIG. 11 generates an initialization signal having a pulse width corresponding to a predetermined period in synchronization with the clock signal dll_clk outputted from the DLL circuit in the memory device at a read operation. Herein, a time point, at which the initialization signal is disabled, is synchronized with the falling edge of the clock signal dll_clk, and a time point, at which the initialization signal is enabled, is synchronized with the rising edge of the clock signal dll_clk.

Figure 12:
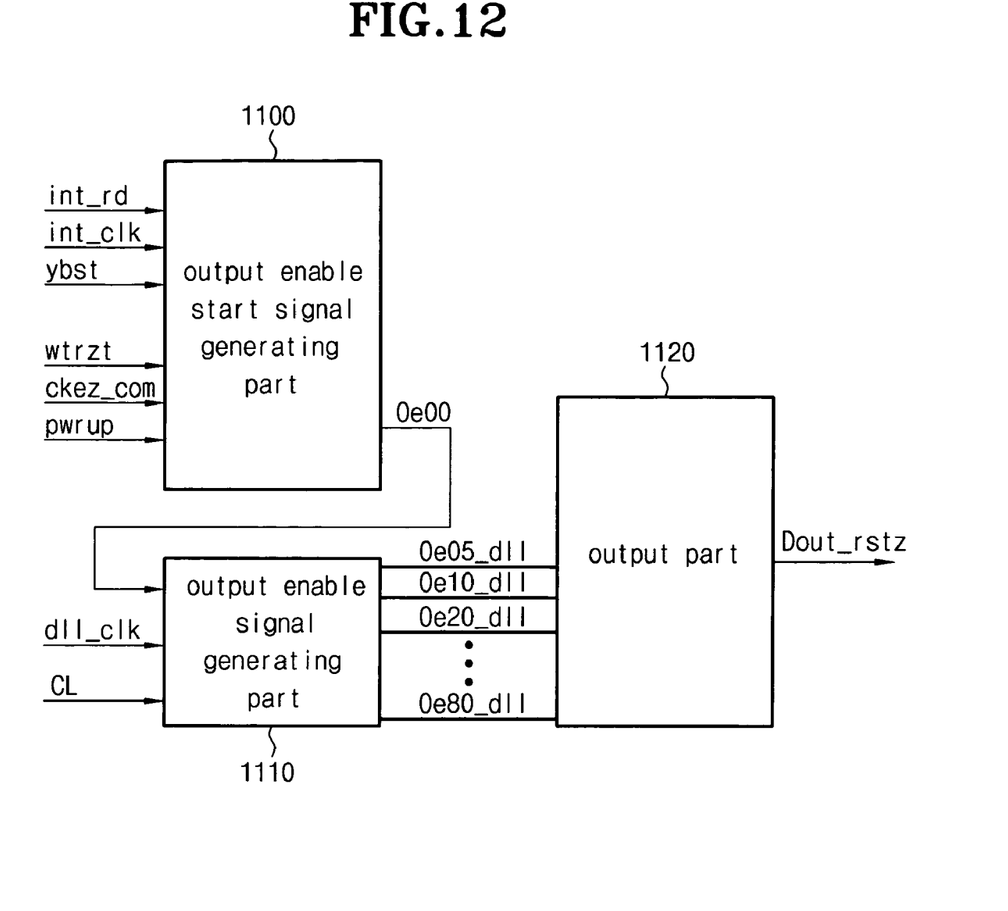
FIG. 12 is a block diagram showing an initialization signal generating apparatus according to a first embodiment of the present invention.

FIG. 12 is a block diagram showing an initialization signal generating apparatus according to a first embodiment of the present invention, and the initialization signal generating apparatus includes an output enable start signal generating part 1100, an output enable signal generating part 1110, and an output part 1120. Signals shown in FIG. 12 are identical to those shown in FIG. 2.

The circuit shown in FIG. 12 basically has the same components as that shown in FIG. 2. However, the circuit shown in FIG. 12 is different from that shown in FIG. 2 in that a time point for the reset of the initialization signal Dout_rstz is adjusted by means of the clock signal dll_clk as described with reference to FIG. 11.

Figure 13:
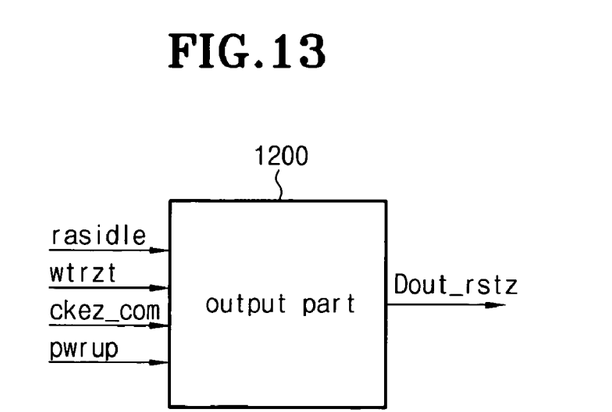
FIG. 13 is a block diagram showing an initialization signal generating apparatus according to a second embodiment of the present invention.

FIG. 13 is a block diagram showing an initialization signal generating apparatus according to a second embodiment of the present invention, and the output part 1120 generates an initialization signal by receiving signals rasidle, wtrzt, ckes_com, and pwrup. Herein, the signal rasidle is disabled at a low level when the memory device is in an active state and is enabled at a high level when the memory device is in an inactive state (i.e., all banks are in a precharge state). Remaining signals wtrzt, ckez_com, and pwrup have functions described with reference to FIG. 2.

Accordingly, when all banks of the memory device are in a precharge state, or when the memory device is in a write mode, a power down mode, or a self-refresh mode, the initialization signal generating part outputs an enable signal for resetting the control part. In other words, the control part is reset only in stable modes and not in a read mode.

Although detailed description about the initialization signal generating apparatus is not given with reference to FIGS. 11 to 13, the initialization signal generating apparatus is designed in such a manner that a time point, at which the initialization signal is disabled, is synchronized with the falling edge of the clock signal corresponding to a read command and a time point, at which the initialization signal is enabled, is synchronized with the rising edge of a clock signal corresponding to a burst stop command. In other words, in FIG. 11, the pulse duration of the initialization signal is determined by a write command and a burst stop command. As a result, the initialization signal includes information regarding CAS latency and the burst length of the memory device.

As described above, when the data outputting method according to the present invention is employed, it is possible to ensure a time margin corresponding to at least a half period in a gap read mode or a gapless read mode. Accordingly, although the operation frequency of the memory device increases, data can be stably outputted.

In addition, information regarding a pipe latch is not given in FIG. 13. However, it is possible to stably output data even when the number of memory devices increases due to a reset operation in a stable mode.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A data output control device for a high-speed memory device, comprising:
   a latch part for storing data read out from a memory cell array through a read operation;
   a control part for controlling an operation of the latch part; and
   an initialization signal generating part for generating an initialization signal for resetting an operation of the control part, wherein the initialization signal is synchronized with a clock signal generated from a DLL circuit in the memory device, wherein a time point, at which the initialization signal is disabled, is synchronized with a rising edge of the clock signal corresponding to a read command, and a time point, at which the initialization signal is enabled, is synchronized with a falling edge of the clock signal corresponding to a burst stop command.

2. The data output control device as claimed in claim 1, wherein the initialization signal includes information regarding CAS latency and a burst length of the memory device.

3. The data output control device as claimed in claim 1, wherein, when all banks of the memory device are in a precharge state, or when the memory device is in a write mode, a power down mode, or a self-refresh mode, the initialization signal generating part outputs an enable signal for resetting the control part.

4. A data output control device for a high-speed memory device, comprising:
   a latch part for storing data read out from a memory cell array through a read operation;
   a control part for controlling an operation of the latch part; and
   an initialization signal generating Dart for generating an initialization signal for resetting an operation of the control part, wherein the initialization signal is synchronized with a clock signal generated from a DLL circuit in the memory device, wherein a time point, at which the initialization signal is disabled, is synchronized with a falling edge of the clock signal corresponding to a read command, and a time point, at which the initialization signal is enabled, is synchronized with a rising edge of the dock signal corresponding to a burst stop command.

5. The data output control device as claimed in claim 4, wherein the initialization signal includes information regarding CAS latency and a burst length of the memory device.

6. The data output control device as claimed in claim 4, wherein, when all banks of the memory device are in a precharge state, or when the memory device is in a write mode, a power down mode, or a self-refresh mode, the initialization signal generating part outputs an enable signal for resetting the control part.

7. A data output control method for a high-speed memory device, comprising a step of, in order to adjust a time point for reset of a control part for controlling an operation of a latch part storing data outputted to an outside of the latch part, generating an initialization signal having a pulse width of a predetermined period in synchronization with a clock signal outputted from a DLL circuit in the memory device at a read operation, wherein a time point, at which the initialization signal is disabled, is synchronized with a rising edge of the clack signal, and a time point at which the initialization signal is enabled, is synchronized with a falling edge of the clock signal.

8. A data output control method for a high-speed memory device, comprising a step of, in order to adjust a time point for reset of a control part for controlling an operation of a latch part storm data outputted to an outside of the latch part generating an initialization signal having a pulse width of a predetermined period in synchronization with a clock signal outputted from a DLL circuit in the memory device at a read operation, wherein a time point, at which the initialization signal is disabled, is synchronized with a falling edge of the clock signal, and a time point at which the initialization signal is enabled, is synchronized with a rising edge of the clock signal.

9. A data output control method for a high-speed memory device, comprising the steps of:
   (a) receiving a read command;
   (b) disabling an initialization signal;
   (c) reading out data from a memory cell array and delivering the data to global input/output lines;
   (d) storing the data in a latch by means of a first control signal;
   (e) outputting the data stored in the latch to an outside of the latch by means of a second control signal;
   (f) enabling the initialization signal; and
   (g) repeating steps (b) to (f) when the read command is applied and then another read command is applied, wherein the first control signal and the second control signal are in an enable state when the initialization signal is in a disable state, the first control signal and the second control signal are in a disable state when the initialization signal is in an enable state, and a time point, at which the initialization signal is enabled or disabled, is synchronized with a clock signal generated from a DLL circuit of the memory device.

10. The data output control method as claimed in claim 9, wherein the time point, at which the initialization signal is disabled, is synchronized with a falling edge of the clock signal, and the time point, at which the initialization signal is enabled, is synchronized with a rising edge of the clock signal.

11. The data output control method as claimed in claim 9, wherein the time point, at which the initialization signal is disabled, is synchronized with a rising edge of the clock signal, and the time point, at which the initialization signal is enabled, is synchronized with a falling edge of the clock signal.

* * * * *